United States Patent
Bi et al.

(10) Patent No.: US 12,020,643 B2
(45) Date of Patent: Jun. 25, 2024

(54) ARRAY SUBSTRATE AND DISPLAY PANEL HAVING A DISPLAY AREA THAT INCLUDES A CURVED EDGE

(71) Applicants: Beijing BOE Optoelectronics Technology Co., Ltd., Beijing (CN); BOE TECHNOLOGY GROUP CO., LTD., Beijing (CN)

(72) Inventors: Yao Bi, Beijing (CN); Yu Zhao, Beijing (CN); Xiaojuan Wu, Beijing (CN); Hongliang Yuan, Beijing (CN); Jian Wang, Beijing (CN); Hao Yan, Beijing (CN); Liping Lei, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/908,386

(22) PCT Filed: Oct. 12, 2021

(86) PCT No.: PCT/CN2021/123178
§ 371 (c)(1),
(2) Date: Aug. 31, 2022

(87) PCT Pub. No.: WO2022/111081
PCT Pub. Date: Jun. 2, 2022

(65) Prior Publication Data
US 2023/0094945 A1    Mar. 30, 2023

(30) Foreign Application Priority Data

Nov. 27, 2020 (CN) .......................... 202011363545.0

(51) Int. Cl.
*G09G 3/3233* (2016.01)
*G11C 19/28* (2006.01)

(52) U.S. Cl.
CPC ......... *G09G 3/3233* (2013.01); *G11C 19/287* (2013.01); *G09G 2300/0426* (2013.01);
(Continued)

(58) Field of Classification Search
None
See application file for complete search history.

(56) References Cited

U.S. PATENT DOCUMENTS

| 2016/0055814 A1* | 2/2016 | Yang | G09G 3/3677 345/55 |
| 2017/0178563 A1* | 6/2017 | Anzai | G09G 3/3677 |
| 2017/0219895 A1* | 8/2017 | Yu | G02F 1/13454 |

FOREIGN PATENT DOCUMENTS

| CN | 101295081 A | 10/2008 |
| CN | 103236273 A | 8/2013 |

(Continued)

OTHER PUBLICATIONS

China Patent Office, First Office Action dated Dec. 21, 2021, for corresponding Chinese application 202011363545.0.
(Continued)

*Primary Examiner* — Kirk W Hermann
(74) *Attorney, Agent, or Firm* — HOUTTEMAN LAW LLC

(57) ABSTRACT

An array substrate having a display area and a peripheral area surrounding the display area, the display area is provided with display units therein, the display area includes a curved edge, the peripheral area is provided therein with a plurality of shift register units cascaded, at positions corresponding to the curved edge of the display area, an extending direction in which a first edge of each shift register unit (Continued)

extends is parallel to an outer tangent line of the curved edge or is consistent with an extending direction in which the curved edge extends, and the first edge is an inner edge of each shift register unit close to the curved edge.

16 Claims, 7 Drawing Sheets

(52) U.S. Cl.
CPC .............. *G09G 2300/0819* (2013.01); *G09G 2300/0842* (2013.01); *G09G 2310/0286* (2013.01); *G09G 2310/08* (2013.01)

(56) References Cited

FOREIGN PATENT DOCUMENTS

| | | | | |
|---|---|---|---|---|
| CN | 104091574 | A | 10/2014 | |
| CN | 106504696 | A * | 3/2017 | ........... G09G 3/3208 |
| CN | 106504696 | A | 3/2017 | |
| CN | 106711180 | A | 5/2017 | |
| CN | 106991990 | A | 7/2017 | |
| CN | 107039008 | A | 8/2017 | |
| CN | 108646474 | A * | 10/2018 | |
| CN | 108646474 | A | 10/2018 | |
| CN | 110136632 | A * | 8/2019 | ............... G09G 3/20 |
| CN | 110136632 | A | 8/2019 | |
| CN | 110297342 | A * | 10/2019 | ............. G02F 1/133 |
| CN | 110660837 | A | 1/2020 | |
| CN | 112435593 | A | 3/2021 | |
| JP | 6779338 | B2 | 11/2020 | |

OTHER PUBLICATIONS

China Patent Office, Second Office Action dated May 13, 2022, for corresponding Chinese application 202011363545.0.
China Patent Office, rejection Office Action dated Aug. 10, 2022, for corresponding Chinese application 202011363545.0.

* cited by examiner

ARRAY SUBSTRATE AND DISPLAY PANEL HAVING A DISPLAY AREA THAT INCLUDES A CURVED EDGE

TECHNICAL FIELD

The present disclosure relates to the field of display technology, and particularly relates to an array substrate and a display panel.

BACKGROUND

With the continuous development of display technologies, users have not only continuously increased requirements on display effect of a display panel, but also continuously increased requirements on a shape of the display panel, so that the variety of the display panels is also continuously increased. Currently, various special-shaped display panels appear in the market, and the special-shaped display panels have been applied to electronic equipments such as watches, mobile phones or intelligent bracelets. Specifically, common shapes of the special-shaped display panels include a fan-shape, an arc-shape, a polygonal-shape, and the like. Further, each display panel at least includes display units located in a display area, and shift register units arranged in an array and located in a peripheral area, and the shift register units are configured to provide driving signals for the display units so as to enable the display panel to display an image.

However, for the special-shaped display panel, since an edge of the display area is a curved edge, the peripheral area is also a special-shaped area, and if the shift register units are arranged in the conventional manner, an area of a region that the shift register units occupy is increased, so that it is difficult to form the special-shaped display panel with a narrow bezel.

SUMMARY

An embodiment of the present disclosure at least partially solves a problem that the existing special-shaped display panel has a relatively wide bezel, and provides an array substrate for forming a special-shaped display panel with a relatively narrow bezel.

The array substrate according to the embodiment of the present disclosure includes a display area and a peripheral area surrounding the display area, the display area is provided therein with display units and includes a curved edge, the peripheral area is provided therein with a plurality of shift register units cascaded, and at positions corresponding to the curved edge of the display area, an extending direction in which a first edge of each shift register unit extends is parallel to an outer tangent line of the curved edge, or is consistent with an extending direction in which the curved edge extends, and the first edge is an inner edge of each shift register unit close to the curved edge.

In some implementations, the curved edge includes a plurality of curved segments, the curved segments correspond to the shift register units one to one, and the extending direction in which the first edge of each shift register unit extends is consistent with an extending direction in which the curved segment corresponding to the shift register unit extends.

In some implementations, the curved edge includes a plurality of tangent points, which are in correspondence with the shift register units one to one, each tangent point is a point at which a distance from the curved edge to the shift register unit corresponding to the tangent point is minimum, and the first edge of each shift register unit is parallel to a tangent line of the curved edge at the tangent point corresponding to the shift register unit.

In some implementations, each of the shift register units further includes a second edge opposite to the first edge, an extending direction in which the second edge extends is parallel to a tangent line of the curved edge.

In some implementations, each of the shift register units further includes a second edge opposite to the first edge, an extending direction in which the second edge extends is consistent with the extending direction in which the curved edge extends.

In some implementations, the curved edge is in any one shape of a circular arc shape or an elliptical arc shape.

In some implementations, an extending direction in which a line connecting centers of the plurality of shift register units extends is consistent with the extending direction in which the curved edge extends.

In some implementations, the plurality of the shift register units are arranged at intervals in the peripheral area.

In some implementations, the display unit includes a plurality of sub-pixels arranged in an array, each row of sub-pixels are connected with a same gate line, and each gate line is connected with an output terminal of at least one of the shift register units.

In some implementations, the display area is further provided with a black matrix therein, and the black matrix is located at a periphery of the display units to form the curved edge of the display area.

In some implementations, each of the shift register units includes a cascade line connected with the output terminal and a first control terminal of the shift register unit, and the cascade line is arranged along the first edge of the shift register unit.

In some implementations, each of the shift register units further includes an input unit, a pull-down control unit, an output unit and an output control unit, and where
the input unit is configured to write a signal of an input terminal into a pull-down node in response to the signal of the input terminal, write a signal of a first voltage terminal into a pull-up node in response to a signal of a first control terminal, and write a signal of a second voltage terminal into the pull-up node in response to a signal of a second control terminal;
the output control unit is configured to write a signal of a third voltage terminal into the output terminal in response to a signal of a first clock terminal;
the output unit is configured to write a signal of a second clock terminal into the output terminal under control of the output control unit and the pull-up node;
the pull-down control unit is configured to write the signal of the first clock terminal into a pull-down control node in response to the signal of the first clock terminal; and
the pull-down unit is configured to write the signal of the third voltage terminal into the pull-down node under control of the pull-down control node and the pull-up node.

In some implementations, the input unit includes a first transistor, a second transistor and a third transistor, and where
a gate of the first transistor is connected to the second control terminal, a first electrode of the first transistor is connected to the second voltage terminal, a second electrode of the first transistor is connected to the pull-up node;

a gate and a first electrode of the second transistor are connected to the input terminal, a second electrode of the second transistor is connected to the pull-down node; and a gate of the third transistor is connected to the first control terminal, a first electrode of the third transistor is connected to the pull-up node, and a second electrode of the third transistor is connected to the first voltage terminal.

In some implementations, the output control unit includes a fourth transistor and a fifth transistor, and where a gate of the fourth transistor is connected to the pull-down node, a first electrode of the fourth transistor is connected to the output terminal, and a second electrode of the fourth transistor is connected to the third voltage terminal; and a gate of the fifth transistor is connected to the first clock terminal, a first electrode of the fifth transistor is connected to the output terminal, and a second electrode of the fifth transistor is connected to the third voltage terminal.

In some implementations, the output unit includes: a sixth transistor and a storage capacitor, and where a gate of the sixth transistor is connected to the pull-up node, a first electrode of the sixth transistor is connected to the second clock terminal, and a second electrode of the sixth transistor is connected to the output terminal; and a first electrode of the storage capacitor is connected to the pull-up node, and a second electrode of the storage capacitor is connected to the output terminal.

In some implementations, the pull-down control unit includes a seventh transistor and an eighth transistor, and where a gate and a first electrode of the seventh transistor are connected to the first clock terminal, and a second electrode of the seventh transistor is connected to the pull-down control node; and a gate of the eighth transistor is connected to the pull-down control node, a first electrode of the eighth transistor is connected to the first clock terminal, and a second electrode of the eighth transistor is connected to the pull-down node.

In some implementations, the pull-down unit includes a ninth transistor, a tenth transistor and an eleventh transistor, and where a gate of the ninth transistor is connected to the pull-down node, a first electrode of the ninth transistor is connected to the pull-up node, and a second electrode of the ninth transistor is connected to the third voltage terminal;

a gate of the tenth transistor is connected to the pull-up node, a first electrode of the tenth transistor is connected to the pull-down control node, and a second electrode of the tenth transistor is connected to the third voltage terminal; and a gate of the eleventh transistor is connected to the pull-up node, a first electrode of the eleventh transistor is connected to the pull-down node, and a second electrode of the eleventh transistor is connected to the third voltage terminal.

An embodiment of the present disclosure further provides a display panel including the array substrate described above.

DRAWINGS

The accompanying drawings, which are included to provide a further understanding of the embodiments of the present disclosure and are incorporated in and constitute a part of this specification, illustrate the embodiments of the present disclosure and together with the detailed description serve to explain the embodiments, but do not limit the embodiments. In the drawings.

Figure 1:
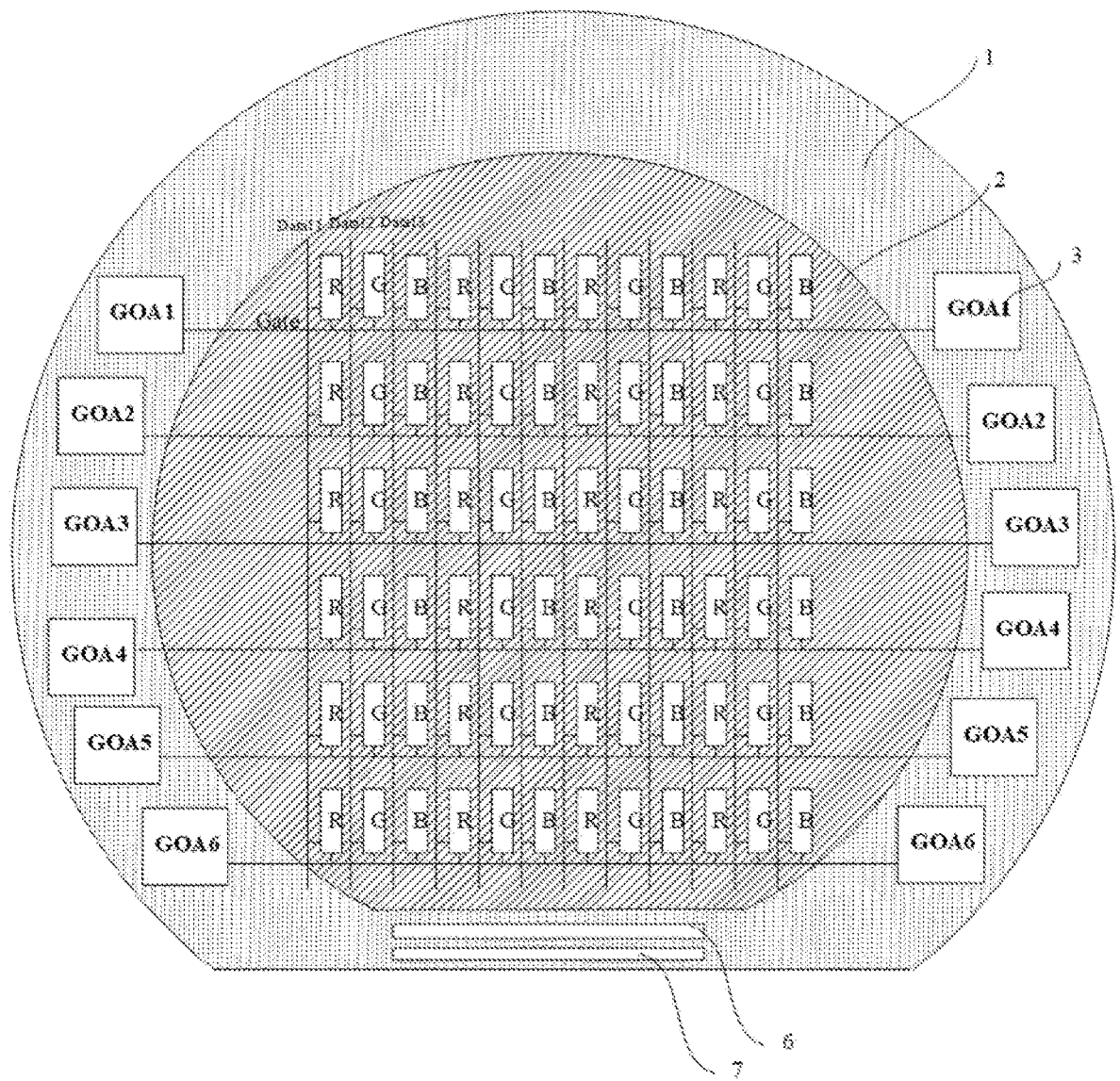
FIG. 1 is a schematic structural diagram of an array substrate according to an embodiment of the present disclosure.

Reference signs are as follows: 1. display area; 11. sub-pixel; 2. peripheral area; 21. curved edge; 22. curved segment; 23. tangent point; 3. shift register unit; 31. first edge; 32. second edge; 33. cascade line; Gate. gate line; Data. data line; 51. input unit; 52. pull-down unit; 53. pull-down control unit; 54. output unit; 55. output control unit; 6. integrated chip; 7. flexible circuit board; T1. first transistor; T2. second transistor; T3. third transistor; T4. fourth transistor; T5. fifth transistor; T6. sixth transistor; T7. seventh transistor; T8. eighth transistor; T9. ninth transistor; T10. tenth transistor; T11. eleventh transistor; T12. twelfth transistor; T13. thirteenth transistor; T14. fourteenth transistor; T15. fifteenth transistor; T16. sixteenth transistor; T17. seventeenth transistor; T18. eighteenth transistor; C. storage capacitor; C1. first capacitor; D. light emitting device; STV. input terminal; PD. pull-down node; PU. pull-up node; PD-CN. pull-down control node; Gate (n+1). first control terminal; Gate (n−1). second control terminal; VSD. first voltage terminal; VDS. second voltage terminal; VGL. third voltage terminal; CLKB. first clock terminal; CLK. second clock terminal; Gate (n). output terminal; Reset. reset signal terminal; VDD. first power supply voltage terminal; EM. light emission control line; Vref. voltage signal terminal; VSS. second power supply voltage terminal.

DETAILED DESCRIPTION

In order to enable those skilled in the art to better understand the technical solutions of the embodiments of the present disclosure, the embodiments of the present disclosure are described in further detail below with reference to the accompanying drawings and specific implementations.

The embodiments of the present disclosure will be described in more detail below with reference to the accompanying drawings. Like elements are denoted by like reference signs throughout the various figures. For purposes of clarity, the various features in the drawings are not drawn to scale. Moreover, certain well-known elements may not be shown in the figures.

Numerous specific details of the embodiments of the present disclosure, such as structures, materials, dimensions, treatment processes and techniques of the components, are set forth in the following description in order to provide a more thorough understanding of the embodiments of the present disclosure. However, as will be understood by those skilled in the art, the embodiments of the present disclosure may be practiced without these specific details.

As shown in FIG. 1, an embodiment of the present disclosure provides an array substrate (may also be known as display substrate) having a display area 1 and a peripheral area 2 surrounding the display area 1.

A plurality of sub-pixels 11 arranged in an array are disposed in the display area 1, the sub-pixels 11 in each row are connected to a same gate line Gate, and the sub-pixels 11 in each column are connected to a same data line Data. As shown in FIG. 1, the plurality of sub-pixels 11 may include sub-pixels 11 of three different colors, for example, red sub-pixels R, green sub-pixels G and blue sub-pixels B. It should be noted here that the color of the sub-pixel 11 in the embodiment of the present disclosure may be determined according to the color of light emitted from a light emitting device in each sub-pixel 11, for example, the light emitted by the light emitting device in the sub-pixel 11 is red light, and in this case, the sub-pixel 11 is referred to as a red sub-pixel R. Certainly, in a case where light emitting devices in the array substrate emit light with a same color, for example, the light emitted by each light emitting device is white light, in a display panel adopting the array substrate, the color of the sub-pixel 11 may be determined according to the color of a color filter in a color filter substrate disposed opposite to the array substrate, for example, in a case where the color of the color filter of the color filter substrate corresponding to a certain sub-pixel 11 is red, the sub-pixel 11 is referred to as a red sub-pixel R.

As shown in FIG. 1, an exemplary structure of the array substrate is shown, the array substrate includes a plurality of data lines in columns and a plurality of gate lines in rows, where the gate lines are intersected with the data lines to define a plurality of sub-pixels 11 at intersection positions. The color of the sub-pixels 11 in a same column is the same, every three sub-pixels 11 adjacent to each other in a row direction form a pixel, and the three sub-pixels 11 in each pixel respectively include a red sub-pixel R, a green sub-pixel G, and a blue sub-pixel B. The sub-pixels 11 in a same row are connected to the same gate line Gate, and the sub-pixels 11 in the same column are connected to the same data line Data (e.g., the red sub-pixels R in the same column are connected to the data line Data11, the green sub-pixels G in the same column are connected to the data line Data12, and the the blue sub-pixels B in the same column are connected to the data line Data13). Each gate line Gate is provided with a gate scan signal by a shift register unit 3 in a stage (for example, FIG. 1 illustrates six stages of shift register units 3, including GOA1 to GOA6, where GOA1 provides the gate scan signal for a first gate line Gate).

Figure 7:
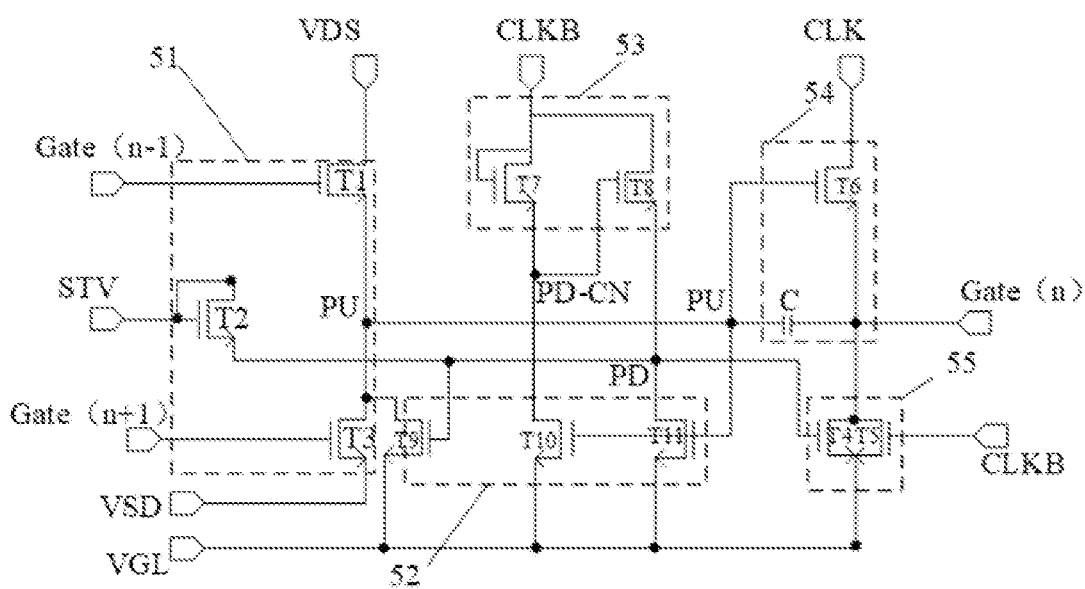
FIG. 7 is a schematic structural diagram of a circuit of a shift register unit in an array substrate according to an embodiment of the present disclosure.

A plurality of shift register units 3 cascaded are arranged in the peripheral area 2, and the shift register units 3 are divided into two parts which are respectively arranged at left and right sides of the display area 1 in a cascade mode. As shown in FIG. 1, taking dual-side driving as an example, that is, each gate line Gate is connected to two shift register units 3. The two shift register units 3 connected to each gate line Gate may be respectively connected to two ends of the gate line Gate (for example, each of left and right ends of the first gate line Gate is connected to one GOA1). Certainly, the shift register units 3 may be connected at middle positions of the gate line Gate, or at any other positions of the gate line Gate. Compared with a single-side driving, that is, an embodiment in which each gate line Gate is connected to only one shift register unit 3, in the embodiment of the present disclosure, since the dual-side driving is adopted, voltages at positions of the whole gate line receiving signals may be better uniform, and a phenomenon that a voltage difference exists between a signal received at one end of the gate line close to the shift register unit 3 and a signal received at another end of the gate line away from the shift register unit 3, due to a line resistance of the gate line itself, can be alleviated. The shift register units 3 are connected together in a cascade mode (i.e., are cascaded), specifically, except for the first stage of shift register unit 3 and the last stage of shift register unit 3, a first control terminal Gate (n+1) of the $n^{th}$ stage of shift register unit 3 is connected to a signal output terminal of the $(n+1)^{th}$ stage of shift register unit 3, and a second control terminal Gate(n−1) of the $n^{th}$ stage of shift register unit 3 is connected to a signal output terminal of the $(n−1)^{th}$ stage of shift register unit 3, where n is an integer greater than 1, as shown in FIG. 7.

Specifically, as shown in FIG. 1, the shift register units 3 located on each side of the display area 1 are arranged in a step mode, and each shift register unit 3 is in a rectangular structure, and thus a relatively large area of the peripheral area 2 is occupied, which is inconvenient for forming the array substrate with a relatively narrow bezel. In addition, since the shift register units 3 correspond to different positions of the display area 1, and in order to adapt to the shape of the peripheral area 2, a plurality of wires (such as a ground wire, signal wires, and the like) located in the peripheral area 2 are desired to be wired manually by a worker, so that the manufacturing process of the array substrate is complicated, and the manufacturing cost is increased.

In a first aspect, as shown in FIGS. 2 to 8, an embodiment of the present disclosure provides an array substrate, which has a display area 1 and a peripheral area 2 surrounding the display area 1. The display area 1 has display units provided therein and includes a curved edge 21. A plurality of shift register units 3 are disposed in the peripheral area 2, and the shift register units 3 at positions in the peripheral area 2 corresponding to the curved edge 21 of the display area 1 are disposed so that an extending direction in which a first edge 31 of each shift register unit 3 extends is parallel to an outer tangent line of the curved edge 21 or is consistent with an extending direction in which the curved edge 21 extends, and the first edge 31 is an inner edge of the shift register unit 3 close to the curved edge 21.

That is, at least part of the edge of the display area 1 is the curved edge 21, so that a special-shaped display area 1 is formed, and at least part of the shift register units 3 are arranged at a periphery of the curved edge 21.

In order to reduce a width of the peripheral area 2, in the embodiment of the present disclosure, any adjacent shift register units 3 located at the periphery of the curved edge 21 are arranged in a rotating mode with respect to each other, that is, the first edge 31 of each shift register unit 3 located at the periphery of the curved edge 21 is configured based on a curvature of the curved edge 21. Specifically, the inner edge of each shift register unit 3 close to the curved edge 21 is the first edge 31 of the shift register unit 3, i.e., the first edge 31 of the shift register unit 3 is the edge of the shift register unit 3 closest to the display area 1.

The first edges 31 of the shift register units 3 located at the periphery of the curved edge 21 are configured based on the curvature of the curved edge 21. Each of the first edges 31 of the shift register units 3 is arranged in the following two modes including a first mode and a second mode.

In the first mode, the extending direction in which the first edge 31 of the shift register unit 3 extends is parallel to the outer tangent line of the curved edge 21. In other words, the first edge 31 of the shift register unit 3 is a straight line, as shown in FIG. 3 (which is a partially enlarged view of a dotted frame portion in FIG. 2) and FIG. 4.

In the second mode, the extending direction in which the first edge 31 of the shift register unit 3 extends is consistent with the extending direction in which the curved edge 21 extends. In other words, the first edge 31 of the shift register unit 3 is a curved line, and the curvature of the curved line of the the first edge 31 is approximate to or the same as the curvature of a portion of the curve edge 21 corresponding to the first edge 31, as shown in FIGS. 5 and 6.

Figure 2:
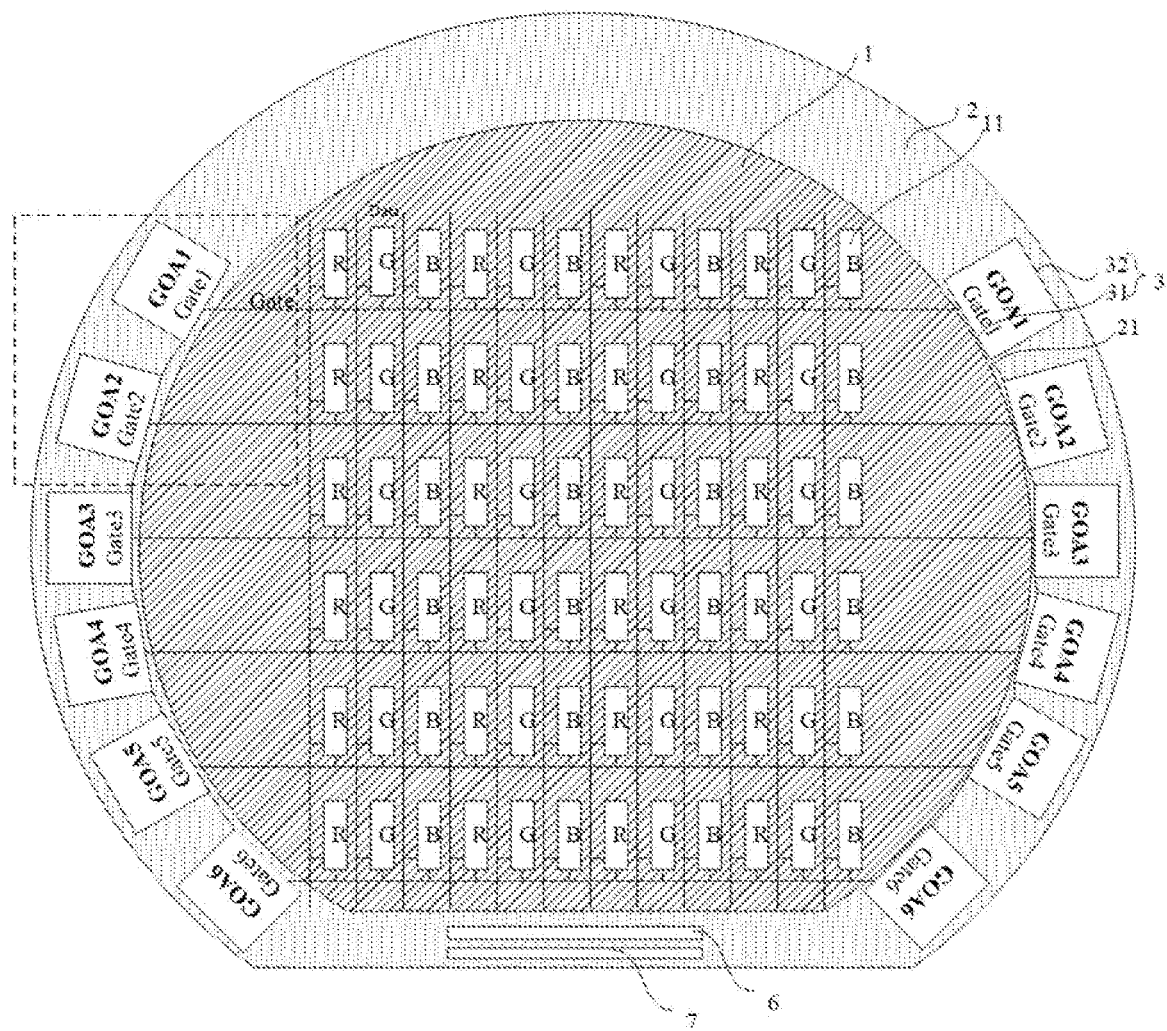
FIG. 2 is a schematic structural diagram of an array substrate according to an embodiment of the present disclosure.
Figure 3:
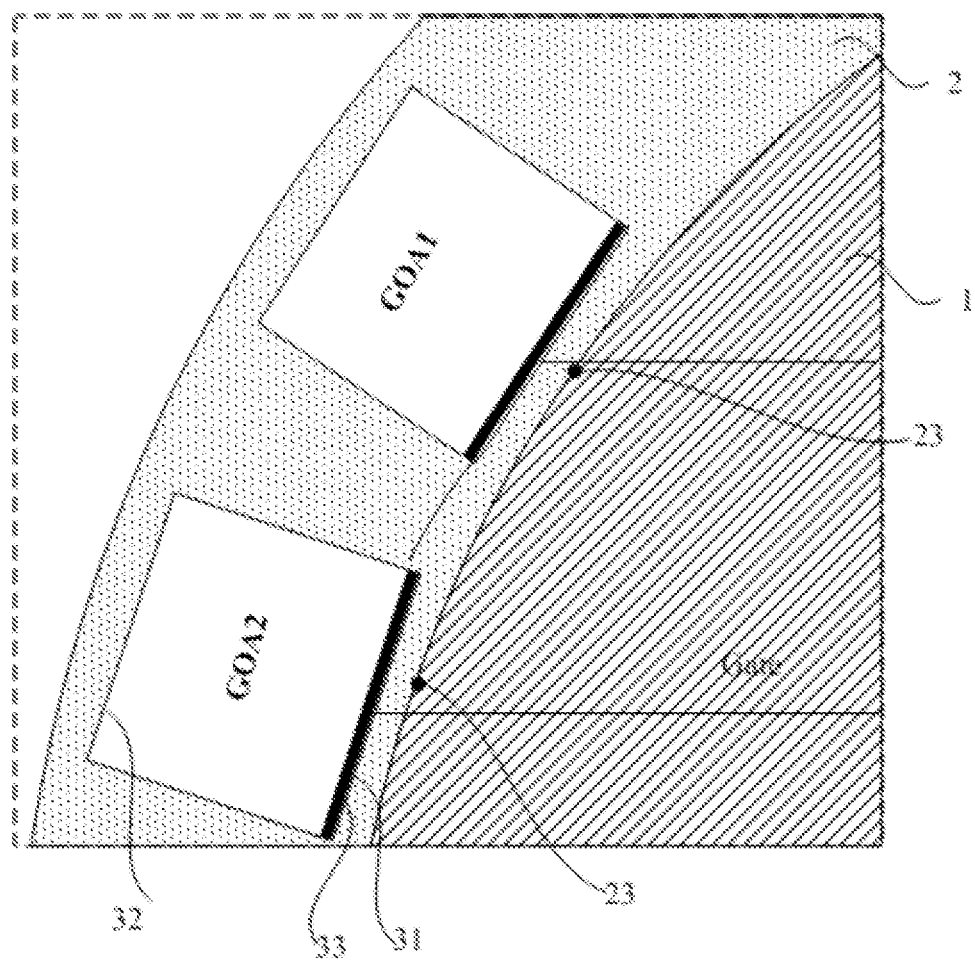
FIG. 3 is a partial enlarged view of a structure of FIG. 2.

As shown in FIG. 2, in the array substrate of the embodiment of the present disclosure, at the position corresponding to the curved edge 21 of the display area 1, the extending direction in which the first edge 31 of the shift register unit 3 extends is parallel to the outer tangent line of the curved edge 21 or is consistent with the extending direction in which the curved edge 21 extends. Compared with the peripheral area 2 of the array substrate shown in FIG. 1, the shift register units 3 shown in FIG. 2 are arranged more closer to the curved edge 21 of the display area 1, so that the peripheral area 2 of the array substrate shown in FIG. 2 is narrower, and a display panel with a narrow bezel can be formed.

In addition, as shown in FIG. 2, since distances between the edges of the shift register units 3 close to the display area 1 in the array substrate according to the embodiment of the present disclosure and the edge of the display area 1 close to the shift register units 3 are approximate or substantially equal to each other, the wires (such as a ground line GND and a common voltage line Vcom, etc.) in the peripheral area 2 may be wired based on the curvature of the curved edge 21, and the wires of all the shift register units 3 may be laid according to a same wiring formula or program, so that the manufacturing process of the array substrate is greatly simplified, the manufacturing cost of the array substrate is greatly reduced, and the manufacturing efficiency of the array substrate is increased.

Figure 5:
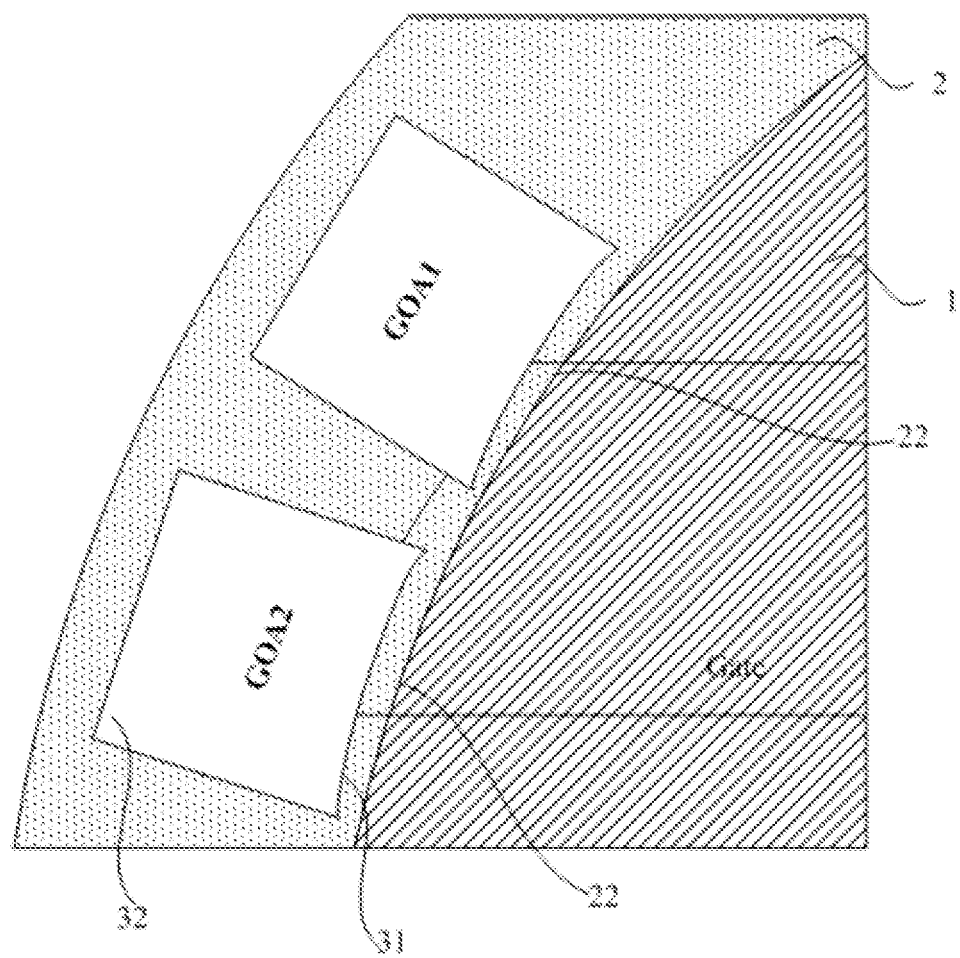
FIG. 5 is a schematic partial structural diagram of an array substrate according to an embodiment of the present disclosure.
Figure 6:
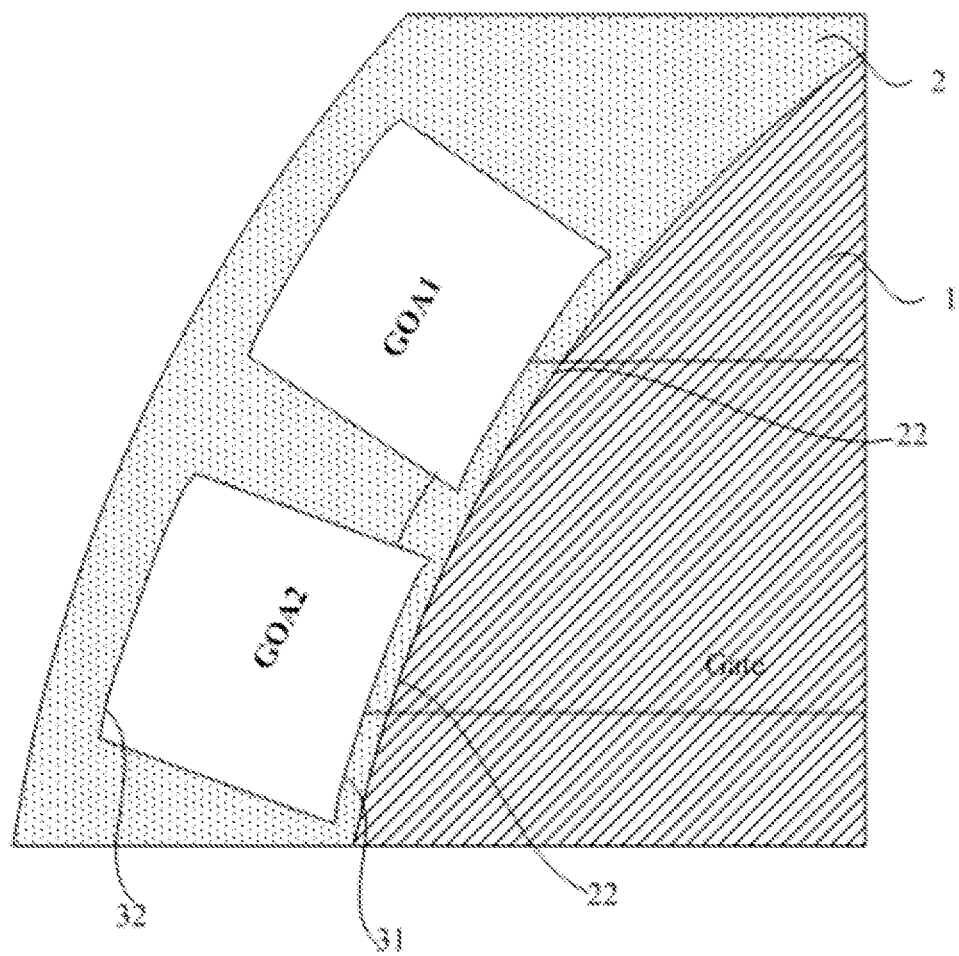
FIG. 6 is a schematic partial structural diagram of an array substrate according to an embodiment of the present disclosure.

In some implementations, as shown in FIGS. 5 and 6, the curved edge 21 includes a plurality of curved segments 22, which corresponds to the shift register units 3 one to one, and the extending direction in which the first edge 31 of each shift register unit 3 extends is consistent with the extending direction in which the curved segment 22 corresponding to the shift register unit 3 extends.

That is, the first edge 31 of each shift register unit 3 is a curved line. Since different portions of the curved edge 21 may have different curvatures, extending directions in which the different portions of the curved edge 21 respectively extend may also be different. The extending direction in which the first edge 31 of each shift register unit 3 extends is only desired to be consistent with the extending direction in which a portion of the curved edge 21 at a position corresponding to the shift register unit 3 extends, so as to achieve the effect of reducing the area of the peripheral area 2. Therefore, in the embodiment of the present disclosure, the portion of the curved edge 21 corresponding to the shift register units 3 is divided into a plurality of curved segments 22, and the shift register units 3 correspond to the curved segments 22 one to one, so that the effect of reducing the area of the peripheral area 2 can be achieved only by making the extending direction in which the first edge 31 of each shift register unit 3 extends being consistent with the extending direction in which the curved segment 22 corresponding to the shift register unit 3 extends.

In a case where the extending direction in which the first edge 31 of each shift register unit 3 extends is consistent with the extending direction in which the curved segment 22 corresponding to the shift register unit 3 extends, each shift register unit 3 can be further approached to the curve edge 21 of the display area 1, thus the peripheral area 2 is narrower, and a display panel with a narrower bezel can be formed.

Figure 4:
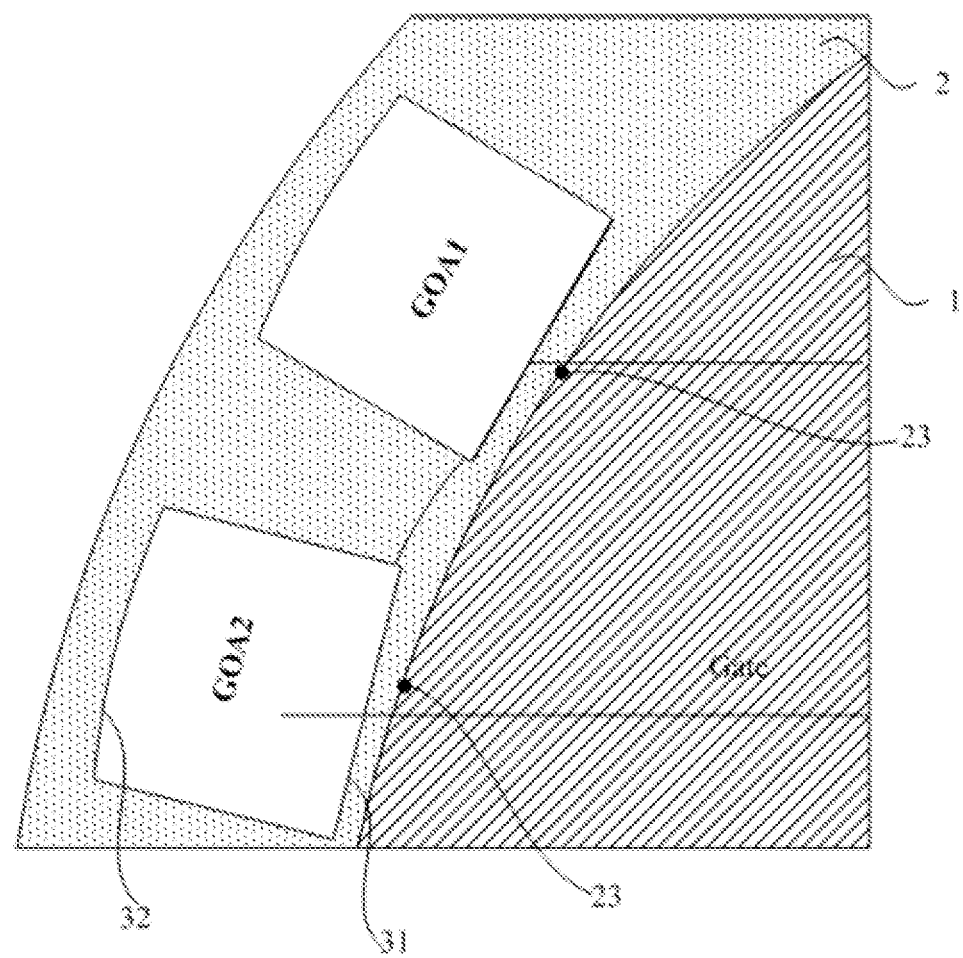
FIG. 4 is a schematic partial structural diagram of an array substrate according to an embodiment of the present disclosure.

In some implementations, as shown in FIGS. 3 and 4, the curved edge 21 includes a plurality of tangent points 23, the tangent points 23 are in correspondence with the shift register units 3 one to one, each tangent point 23 is a point at which a distance from the curved edge 21 to the shift register unit 3 corresponding to the tangent point is the minimum, and the first edge 31 of each shift register unit 3 is parallel to a tangent line of the curved edge 21 at the tangent point 23 corresponding to the shift register unit 3.

That is, the first edge 31 of the shift register unit 3 is a straight line. Since different portions of the curved edge 21 may have different curvatures, directions in which outer tangent lines at different positions of the curved edge 21 respectively extend may also be different. The first edge 31 of each shift register unit 3 is only desired to be parallel to the out tangent line at a position of the curved edge 21 close to the shift register unit 3, so as to achieve the effect of reducing the area of the peripheral area 2. In the embodiment of the present disclosure, a plurality of tangent points 23 are selected on the curved edge 21, and each tangent point 23 is a point at which the curved edge 21 is closest to the shift register unit 3 corresponding to the tangent point 23, so that the effect of reducing the area of the peripheral area 2 can be achieved only by making the first edge 31 of each shift register unit 3 being parallel to the tangent line at the tangent point 23 corresponding to the shift register unit 3.

In a case where the first edge 31 of each shift register unit 3 is parallel to the tangent line at the tangent point 23 of the curved edge 21 corresponding to the shift register unit 3, each shift register unit 3 can be further approached to the curve edge 21 of the display area 1, thus the peripheral area 2 is narrower, and a display panel with a narrower bezel can be formed.

In some implementations, as shown in FIGS. 3 and 5, each shift register unit 3 further includes a second edge 32 opposite to the first edge 31, an extending direction in which the second edge 32 extends is parallel to the outer tangent line of the curved edge 21.

The second edge 32 of the shift register unit 3 is an edge of the shift register unit 3 away from the display area 1, i.e., the second edge 32 is the edge of the shift register unit 3 closest to an outer edge of the peripheral area 2, and thus the shape of the second edge 32 is also an important factor for determining the area of the peripheral area 2.

As shown in FIGS. 3 and 5, in the embodiment of the present disclosure, the extending direction in which the second edge 32 extends is parallel to the outer tangent line of the curved edge 21, that is, in a case where the first edge 31 is parallel to the outer tangent line of the curved edge 21, the second edge 32 is parallel to the first edge 31.

It should be noted that, in a case where the second edge 32 is parallel to the first edge 31, the shift register unit 3 further has two third edges connecting the second edge 32 with the first edge 31, and the third edges may be perpendicular to the first edge 31, so that the shift register unit 3 is in a rectangular shape, as shown in FIG. 3. The third edges may also be not perpendicular to the first edge 31, so that the shift register unit 3 is in a trapezoidal shape or any other suitable shape.

In a case where the extending direction in which the second edge 32 extends is parallel to the outer tangent line of the curved edge 21, each shift register unit 3 can be further approached to the curve edge 21 of the display area 1, thus the peripheral area 2 is narrower, and a display panel with a narrower bezel can be formed.

In some implementations, as shown in FIGS. 4 and 6, each shift register unit 3 further includes a second edge 32 opposite to the first edge 31, and an extending direction in which the second edge 32 extends is consistent with the extending direction in which the curved edge 21 extends.

In the embodiment of the present disclosure, in a case where the extending direction in which the second edge 32 extends is consistent with the extending direction in which the curved edge 21 extends, and the extending direction in which the first edge 31 extends is consistent with the extending direction in which the curved edge 21 extends, the extending directions in which the second edge 32 and the first edge 31 extend are the same, as shown in FIG. 6.

In a case where the extending direction in which the second edge 32 extends is consistent with the extending direction in which the curved edge 21 extends, each shift register unit 3 can be further approached to the curve edge 21 of the display area 1, thus the peripheral area 2 is narrower, and a display panel with a narrower bezel can be formed.

In some implementations, a shape of the curved edge 21 is any one of a circular arc shape or an elliptical arc shape. It should be noted that the shape of the curved edge 21 may also be an irregular arc shape in an actual display panel, and is not listed here.

In some implementations, an extending direction in which a line connecting centers of the plurality of shift register units 3 is consistent with the extending direction in which the curved edge 21 extends.

In other words, for the plurality of shift register units 3, a trend of the arrangement of the shift register units 3 is consistent with a trend of the extending direction in which the curved edge 21 extends, so that each shift register unit 3 can be further approached to the curve edge 21 of the display area 1, thus the peripheral area 2 is narrower, and a display panel with a narrower bezel can be formed.

In some implementations, the display unit includes a plurality of sub-pixels 11 arranged in an array, each row of sub-pixels 11 are connected to a same gate line Gate, and each gate line Gate is connected to an output terminal Gate(n) of at least one of the shift register units 3.

As shown in FIG. 2, the plurality of sub-pixels 11 are arranged in an array in the display area 1, each row of sub-pixels 11 are connected to a same gate line Gate, and each column of sub-pixels 11 are connected to a same data line Data. The plurality of sub-pixels 11 may include sub-pixels 11 of three different colors, for example, a red sub-pixel R, a green sub-pixel G, and a blue sub-pixel B.

Figure 8:
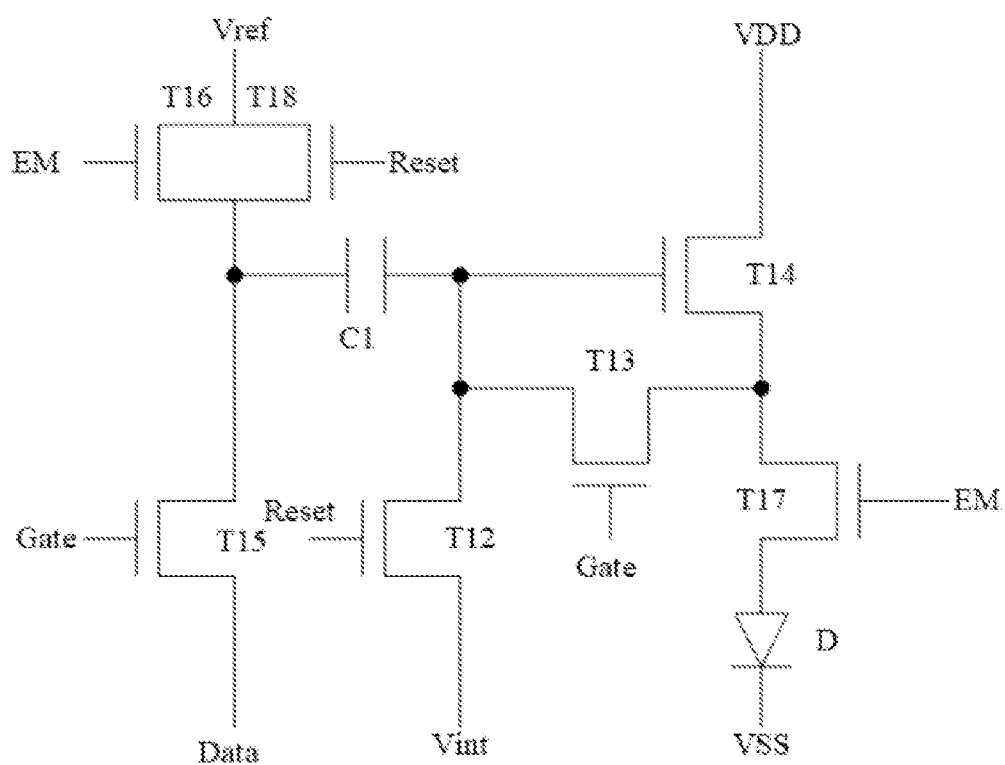
FIG. 8 is a structural diagram of a pixel driving circuit of an array substrate according to an embodiment of the present disclosure.

Each of the sub-pixels 11 at least includes a pixel circuit therein, as shown in FIG. 8, in an example, the pixel circuit includes a twelfth transistor T12, a thirteenth transistor T13, a fourteenth transistor T14, a fifteenth transistor T15, a sixteenth transistor T16, a seventeenth transistor T17, an eighteenth transistor T18, a first capacitor C1, and a light emitting device D. A first electrode of the twelfth transistor T12 is connected to an initial voltage signal terminal Vint, a second electrode of the twelfth transistor T12 is connected to a second electrode of the first capacitor C1, a first electrode of the thirteenth transistor T13 and a control electrode of the fourteenth transistor T14, and a control electrode of the twelfth transistor T12 are connected to a reset signal terminal Reset. A second electrode of the thirteenth transistor T13 is connected to a second electrode of the fourteenth transistor T14 and a first electrode of the seventeenth transistor T17, and a control electrode of the thirteenth transistor T13 is connected to the gate line Gate. A first electrode of the fourteenth transistor T14 is connected to a first power supply voltage terminal VDD. A first electrode of the fifteenth transistor T15 is connected to a data line Data, a second electrode of the fifteenth transistor T15 is connected to a second electrode of the sixteenth transistor T16, a second electrode of the eighteenth transistor T18 and a first electrode of the first capacitor C1. A control electrode of the fifteenth transistor T15 is connected to the gate line Gate. A first electrode of the sixteenth transistor T16 is connected to a reference voltage signal terminal Vref, and a control electrode of the sixteenth transistor T16 is connected to an light emission control line EM. A second electrode of the seventeenth transistor T17 is connected to a first electrode of the light emitting device D, and a control electrode of the seventeenth transistor T17 is connected to the light emission control line EM. A first electrode of the eighteenth transistor T18 is connected to the reference voltage signal terminal Vref, a control electrode of the eighteenth transistor T18 is connected to the reset signal terminal Reset, and a second electrode of the light emitting device D is connected to a second power supply voltage terminal VSS.

The light emitting device D may be an electric current type light emitting diode, and further may be an electric current type inorganic light emitting diode, such as a Micro Light Emitting Diode (Micro LED) or a Mini Light Emitting Diode (Mini LED), and certainly, the light emitting device D in the embodiment of the present disclosure may also be an Organic Light Emitting Diode (OLED). One of the first electrode and the second electrode of the light emitting device D is an anode and the other of the first electrode and the second electrode of the light emitting device D is a cathode.

In some implementations, a black matrix is further disposed in the display area 1, and the black matrix is located at the periphery of the display units to form the curved edge 21 of the display area 1.

Since each sub-pixel 11 is in the rectangular shape and the sub-pixels 11 are arranged in an array, the edges of the display units cannot be formed into the curved edge 21, thus the black matrix is disposed in the display area 1 at the periphery of the display units to form the curved edge 21 of the display area 1, that is, at least a part of an edge of the black matrix in the display area 1 coincides with the curved edge 21 of the display area 1.

It should be noted that the curved edge 21 of the display area 1 may also be formed by other structures in the display area 1, such as a connecting line in the display area 1.

In some implementations, the plurality of shift register units 3 are arranged at intervals in the peripheral area 2, and the plurality of shift register units 3 are cascaded.

Specifically, except for the shift register unit 3 at the first stage and the shift register unit 3 at the last stage, a first control terminal Gate(n+1) of the $n^{th}$ stage of shift register unit 3 is connected to a signal output terminal of the $(n+1)^{th}$ stage of shift register unit 3, and a second control terminal Gate(n−1) of the $n^{th}$ stage of shift register unit 3 is connected to a signal output terminal of the $(n-1)^{th}$ stage of shift register unit 3, where n is an integer greater than 1.

In some implementations, the display substrate is a dual-side driving type display substrate, that is, each row of sub-pixels 11 are driven by two shift register units 3, and correspondingly, each row of sub-pixels 11 corresponds to two shift register units 3. Specifically, taking a row of sub-pixels 11 as an example, the row of sub-pixels 11 are connected to a same gate line Gate, the signal output terminals Gate(n) of the two shift register units 3 are respectively connected to two ends of the gate line Gate, that is, two shift register units are arranged corresponding to one gate line Gate. In such way, if one of the two shift registers at the two ends of the gate line Gate is damaged, the gate line Gate may be provided with a gate scan signal through the other of the two shift registers. Certainly, in the embodiment of the present disclosure, the two shift register units 3 may also be located in a middle area of the display substrate, for example, each shift register unit 3 is located in a gap between two adjacent columns of sub-pixels 11, and the two shift register units 3 driving the same gate line Gate are located in different gaps each between two adjacent columns of sub-pixels 11. The positions of the shift register units 3 are not limited in the embodiment of the present disclosure.

In some implementations, as shown in FIG. 3, each shift register unit 3 includes a cascade line 33 connected with the output terminal Gate(n) and the first control terminal Gate (n+1) of the shift register unit 3, and the cascade line 33 is arranged along the first edge 31 of the shift register unit 3.

In other words, the cascade line 33 connects the signal output terminal Gate(n) with the first control terminal Gate (n+1) of the shift register unit 3 at the $n^{th}$ stage, and the cascade line 33 is arranged along the first edge 31 of the shift register unit 3, that is, the cascade line 33 of the shift register unit 3 is parallel to the outer tangent line of a portion of the curved edge 21 corresponding to the shift register unit 3, or extends in an extending direction consistent with the extending direction in which the portion of the curved edge 21 corresponding to the shift register unit 3 extends, such that the cascade line 33 serves to define the first edge 31 of the shift register unit 3.

It should be noted that each shift register unit 3 further includes other signal lines, such as a clock line, etc., and the other signal lines may be disposed on a side of the cascade line 33 away from the display area 1, and in some implementations, extending directions in which the other signal lines extend are consistent with the extending direction in which the cascade line 33 extends.

In some implementations, as shown in FIG. 7, each shift register unit 3 further includes an input unit 51, a pull-down unit 52, a pull-down control unit 53, an output unit 54, and an output control unit 55. The shift register unit 3 of the $n^{th}$ stage will be described below as an example.

In the shift register unit 3 of the $n^{th}$ stage, the input unit 51 writes a signal of an input terminal STV into a pull-down node PD in response to the signal of the input terminal STV, writes a signal of a first voltage terminal VSD into a pull-up node PU in response to a signal of the first control terminal Gate(n+1), and writes a signal of a second voltage terminal VDS into the pull-up node PU in response to a signal of the second control terminal Gate(n−1).

The output control unit 55 writes a signal of a third voltage terminal VGL into the output terminal Gate(n) in response to a signal of a first clock terminal CLKB.

The output unit 54 writes a signal of a second clock terminal CLK into the output terminal Gate(n) under control of the output control unit 55 and the pull-up node PU.

The pull-down control unit 53 writes a signal of the first clock terminal CLKB into a pull-down control node PD-CN in response to the signal of the first clock terminal CLKB.

The pull-down unit 52 writes the signal of the third voltage terminal VGL into a pull-down node PD under control of the pull-down control node PD-CN and the pull-up node PU.

As illustrated in FIG. 7, an example of the shift register unit 3 is shown. Specifically, the input unit 51 includes a first transistor T1, a second transistor T2, and a third transistor T3, where a gate of the first transistor T1 is connected to the second control terminal Gate(n−1), a first electrode of the first transistor T1 is connected to the second voltage terminal VDS, and a second electrode of the first transistor T1 is connected to the pull-up node PU; a gate and a first electrode of the second transistor T2 are connected to the input terminal STV, and a second electrode of the second transistor T2 is connected to the pull-down node PD; a gate of the third transistor T3 is connected to the first control terminal Gate(n+1), a first electrode of the third transistor T3 is connected to the pull-up node PU, and a second electrode of the third transistor T3 is connected to the first voltage terminal VSD.

The output control unit 55 includes a fourth transistor T4, a fifth transistor T5, where a gate of the fourth transistor T4 is connected to the pull-down node PD, a first electrode of the fourth transistor T4 is connected to the output terminal Gate(n), and a second electrode of the fourth transistor T4 is connected to the third voltage terminal VGL; a gate of the fifth transistor T5 is connected to the first clock terminal CLKB, a first electrode of the fifth transistor T5 is connected to the output terminal Gate(n), and a second electrode of the fifth transistor T5 is connected to the third voltage terminal VGL.

The output unit 54 includes a sixth transistor T6 and a storage capacitor C, where a gate of the sixth transistor T6 is connected to the pull-up node PU, a first electrode of the sixth transistor T6 is connected to the second clock terminal CLK, and a second electrode of the sixth transistor T6 is connected to the output terminal Gate(n); a first end of the storage capacitor C is connected to the pull-up node PU, and a second electrode of the storage capacitor C is connected to the output terminal Gate(n).

The pull-down control unit 53 includes a seventh transistor T7 and an eighth transistor T8, where a gate and a first electrode of the seventh transistor T7 are connected to the first clock terminal CLKB, and a second electrode of the seventh transistor T7 is connected to the pull-down control node PD-CN; a gate of the eighth transistor T8 is connected to the pull-down control node PD-CN, a first electrode of the eighth transistor T8 is connected to the first clock terminal CLKB, and a second electrode of the eighth transistor T8 is connected to the pull-down node PD.

The pull-down unit 52 includes a ninth transistor T9, a tenth transistor T10, an eleventh transistor T11, where a gate of the ninth transistor T9 is connected to the pull-down node PD, a first electrode of the ninth transistor T9 is connected to the pull-up node PU, and a second electrode of the ninth transistor T9 is connected to the third voltage terminal VGL; a gate of the tenth transistor T10 is connected to the pull-up node PU, a first electrode of the tenth transistor T10 is connected to the pull-down control node PD-CN, and a second electrode of the tenth transistor T10 is connected to the third voltage terminal VGL; a gate of the eleventh transistor T11 is connected to the pull-up node PU, a first electrode of the eleventh transistor T11 is connected to the pull-down node PD, and a second electrode of the eleventh transistor T11 is connected to the third voltage terminal VGL.

It should be noted that the transistors used in the embodiment of the present disclosure may be thin film transistors or field effect transistors or other devices with the same characteristics, and since a source and a drain of the transistor adopted are symmetrical, the source and the drain may be exchanged. In the embodiment of the present disclosure, to differentiate the source and the drain of the transistor, one of the source and the drain is referred to as the first electrode, and the other of the source and the drain is referred to as the second electrode, and the gate is referred to as the control electrode. In addition, the transistors can be divided into N type transistors and P type transistors according to the characteristics of the transistors, when the P type transistors are adopted, the first electrode is the source of the P type transistor, the second electrode is the drain of the P type transistor, when the gate is applied with a low level, a current flows between the source and the drain. When the N type transistors are adopted, the first electrode is the source of the N type transistor, the second electrode is the drain of the N type transistor, and when the gate is applied with a high level, a current flows between the source and the drain. The transistors in the pixel circuit described above are all illustrated as N type transistors, the implementation using P type transistors is conceivable for those skilled in the art without creative efforts, and therefore is within the protection scope of the present disclosure.

It should be noted that the array substrate of the embodiment of the present disclosure further includes an integrated chip 6 and a flexible circuit board 7 located in the peripheral area 2, which are respectively connected to the display units and configured to provide signals to the display units.

In a second aspect, an embodiment of the present disclosure provides a display panel including the array substrate.

Specifically, the display panel may be any product or component having a display function, such as a liquid crystal display panel, an Organic Light Emitting Diode (OLED) display panel, electronic paper, a mobile phone, a tablet computer, a television, a display, a notebook computer, a digital photo frame, a navigator, and the like.

It should be noted that, herein, relational terms such as first and second, and the like are used solely to distinguish one entity or action from another entity or action without necessarily requiring or implying any actual such relationship or order between such entities or actions. Also, the terms "comprises/comprising" "includes/including" or any other variation thereof, are intended to cover a non-exclusive inclusion, such that a process, method, article, or apparatus that includes a list of elements does not include only those elements but may include other elements not expressly listed or inherent to such process, method, article, or apparatus. Without further limitation, an element defined by the phrase "comprising a . . . " does not exclude the presence of other identical elements in the process, method, article, or apparatus that comprises the element.

According to the implementations of the embodiments of the present disclosure, for example, as described above, these embodiments do not describe all the details, and the embodiments of the present disclosure are not limited to the specific embodiments described. Obviously, many modifications and changes can be made according to the above description. These embodiments are selected and specifically described in this specification to better explain the principles and practical applications of the present disclosure, so that those skilled in the art can make good use of the embodiments of the present disclosure and modifications of the embodiments of the present disclosure. The embodiments of the present disclosure are only limited by the claims and their full scope and equivalents.

What is claimed is:

1. An array substrate, comprising a display area and a peripheral area surrounding the display area, wherein the display area is provided therein with display units and comprises a curved edge, the peripheral area is provided therein with a plurality of shift register units cascaded, and wherein at positions corresponding to the curved edge of the display area, an extending direction in which a first edge of each shift register unit extends is parallel to an outer tangent line of the curved edge or is consistent with an extending direction in which the curved edge extends, and the first edge is an inner edge of each shift register unit close to the curved edge;

each of the shift register units comprises a cascade line connected with an output terminal and a first control terminal of the shift register unit, and the cascade line is arranged along the first edge of the shift register unit;

each of the shift register units further comprises an input unit, a pull-down unit, a pull-down control unit, an output unit and an output control unit, and wherein the input unit is configured to write a signal of an input terminal into a pull-down node in response to the signal of the input terminal, write a signal of a first voltage terminal into a pull-up node in response to a signal of a first control terminal, and write a signal of a second voltage terminal into the pull-up node in response to a signal of a second control terminal;

the output control unit is configured to write a signal of a third voltage terminal into the output terminal in response to a signal of a first clock terminal;

the output unit is configured to write a signal of a second clock terminal into the output terminal under control of the output control unit and the pull-up node;

the pull-down control unit is configured to write the signal of the first clock terminal into a pull-down control node in response to the signal of the first clock terminal; and the pull-down unit is configured to write the signal of the third voltage terminal into the pull-down node under control of the pull-down control node and the pull-up node.

2. The array substrate of claim 1, wherein the curved edge comprises a plurality of curved segments, the curved segments correspond to the shift register units one to one, and the extending direction in which the first edge of each shift register unit extends is consistent with an extending direction in which the curved segment corresponding to the shift register unit extends.

3. The array substrate of claim 1, wherein the curved edge comprises a plurality of tangent points, which are in correspondence with the shift register units one to one, each tangent point is a point at which a distance from the curved edge to the shift register unit corresponding to the tangent point is minimum, and the first edge of each shift register unit is parallel to a tangent line of the curved edge at the tangent point corresponding to the shift register unit.

4. The array substrate of claim 1, wherein each of the shift register units further comprises a second edge opposite to the first edge, an extending direction in which the second edge extends is parallel to a tangent line of the curved edge.

5. The array substrate of claim 1, wherein each of the shift register units further comprises a second edge opposite to the first edge, an extending direction in which the second edge extends is consistent with the extending direction in which the curved edge extends.

6. The array substrate of claim 1, wherein the curved edge is in any one shape of a circular arc shape or an elliptical arc shape.

7. The array substrate of claim 1, wherein an extending direction in which a line connecting centers of the plurality of shift register units extends is consistent with the extending direction in which the curved edge extends.

8. The array substrate of claim 1, wherein the plurality of the shift register units are arranged at intervals in the peripheral area.

9. The array substrate of claim 1, wherein each of the display units comprises a plurality of sub-pixels arranged in an array, each row of sub-pixels are connected with a same gate line, and each gate line is connected with an output terminal of at least one of the shift register units.

10. The array substrate of claim 1, wherein the display area is further provided with a black matrix therein, and the black matrix is located at a periphery of the display units to form the curved edge of the display area.

11. The array substrate of claim 1, wherein the input unit comprises a first transistor, a second transistor and a third transistor, and wherein
- a gate of the first transistor is connected to the second control terminal, a first electrode of the first transistor is connected to the second voltage terminal, and a second electrode of the first transistor is connected to the pull-up node;
- a gate and a first electrode of the second transistor are connected to the input terminal, and a second electrode of the second transistor is connected to the pull-down node; and
- a gate of the third transistor is connected to the first control terminal, a first electrode of the third transistor is connected to the pull-up node, and a second electrode of the third transistor is connected to the first voltage terminal.

12. The array substrate of claim 1, wherein the output control unit comprises a fourth transistor and a fifth transistor, and wherein
- a gate of the fourth transistor is connected to the pull-down node, a first electrode of the fourth transistor is connected to the output terminal, and a second electrode of the fourth transistor is connected to the third voltage terminal; and
- a gate of the fifth transistor is connected to the first clock terminal, a first electrode of the fifth transistor is connected to the output terminal, and a second electrode of the fifth transistor is connected to the third voltage terminal.

13. The array substrate of claim 1, wherein the output unit comprises a sixth transistor and a storage capacitor, and wherein
- a gate of the sixth transistor is connected to the pull-up node, a first electrode of the sixth transistor is connected to the second clock terminal, and a second electrode of the sixth transistor is connected to the output terminal; and
- a first electrode of the storage capacitor is connected to the pull-up node, and a second electrode of the storage capacitor is connected to the output terminal.

14. The array substrate of claim 1, wherein the pull-down control unit comprises a seventh transistor and an eighth transistor, and wherein
- a gate and a first electrode of the seventh transistor are connected to the first clock terminal, and a second electrode of the seventh transistor is connected to the pull-down control node; and
- a gate of the eighth transistor is connected to the pull-down control node, a first electrode of the eighth transistor is connected to the first clock terminal, and a second electrode of the eighth transistor is connected to the pull-down node.

15. The array substrate of claim 1, wherein the pull-down unit comprises a ninth transistor, a tenth transistor and an eleventh transistor, and wherein
- a gate of the ninth transistor is connected to the pull-down node, a first electrode of the ninth transistor is connected to the pull-up node, and a second electrode of the ninth transistor is connected to the third voltage terminal;
- a gate of the tenth transistor is connected to the pull-up node, a first electrode of the tenth transistor is connected to the pull-down control node, and a second electrode of the tenth transistor is connected to the third voltage terminal; and
- a gate of the eleventh transistor is connected to the pull-up node, a first electrode of the eleventh transistor is connected to the pull-down node, and a second electrode of the eleventh transistor is connected to the third voltage terminal.

16. A display panel, comprising the array substrate of claim 1.

* * * * *